US011751345B2

(12) United States Patent
Waggener, Jr.

(10) Patent No.: US 11,751,345 B2
(45) Date of Patent: *Sep. 5, 2023

(54) THERMAL ISOLATION OF FLIGHT RECORDER MEMORY CORE

(71) Applicant: L3 TECHNOLOGIES, INC., New York, NY (US)

(72) Inventor: William N. Waggener, Jr., Sarasota, FL (US)

(73) Assignee: L3 TECHNOLOGIES, INC., New York, NY (US)

( * ) Notice: Subject to any disclaimer, the term of this patent is extended or adjusted under 35 U.S.C. 154(b) by 239 days.

This patent is subject to a terminal disclaimer.

(21) Appl. No.: 17/118,206

(22) Filed: Dec. 10, 2020

(65) Prior Publication Data

US 2021/0100115 A1    Apr. 1, 2021

Related U.S. Application Data

(63) Continuation of application No. 15/796,588, filed on Oct. 27, 2017, now Pat. No. 10,917,983.

(51) Int. Cl.
*H05K 5/02* (2006.01)
*H01H 50/02* (2006.01)
(Continued)

(52) U.S. Cl.
CPC ......... *H05K 5/0213* (2013.01); *H01H 50/023* (2013.01); *B64D 2045/0065* (2013.01); *G07C 5/0841* (2013.01)

(58) Field of Classification Search
CPC ............... H05K 5/0213; H01H 50/023; B64D 2045/0065; G07C 5/0841
(Continued)

(56) References Cited

U.S. PATENT DOCUMENTS 3,207,354 A    9/1965 Skinner et al.
3,906,370 A    9/1975 Apps
(Continued)

FOREIGN PATENT DOCUMENTS

CN      2727860 Y    9/2005
CN    201859488 U    6/2011
(Continued)

OTHER PUBLICATIONS

Notice on the First Office Action (PCT Application in the National Phase) dated Jan. 28, 2021 on related Chinese patent application 201880070202.X by the China National Intellectual Property Administration.

(Continued)

*Primary Examiner* — Mahmoud S Ismail
(74) *Attorney, Agent, or Firm* — DICKINSON WRIGHT PLLC

(57) ABSTRACT

Various systems may benefit from appropriate thermal protection. For example, various flight recorder systems may benefit from thermal isolation of a flight recorder memory core. A system can include a memory core of a flight recorder. The system can also include an inner chamber housing the memory core. The system can further include an outer chamber housing the inner chamber with a vacuum between the inner chamber and the outer chamber. The system can additionally include a signal path from avionics equipment to the memory core through the outer chamber and the inner chamber. The system can also include a power path for the memory core through the outer chamber and the inner chamber.

12 Claims, 5 Drawing Sheets

(51) Int. Cl.
*B64D 45/00* (2006.01)
*G07C 5/08* (2006.01)

(58) Field of Classification Search
USPC ........................................ 701/32.2
See application file for complete search history.

(56) References Cited

U.S. PATENT DOCUMENTS

| | | | | |
|---|---|---|---|---|
| 4,944,401 | A * | 7/1990 | Groenewegen | H05K 5/0213 |
| | | | | 220/592.2 |
| 5,366,105 | A * | 11/1994 | Kerman | F41J 13/00 |
| | | | | 89/36.02 |
| 5,508,922 | A | 4/1996 | Clavelloux et al. | |
| 5,552,608 | A * | 9/1996 | Gallagher | H01J 37/244 |
| | | | | 250/397 |
| 6,153,720 | A | 11/2000 | Olzak et al. | |
| 8,670,879 | B1 | 3/2014 | Angelucci | |
| 2006/0272838 | A1* | 12/2006 | Sauerzweig | H05K 5/0213 |
| | | | | 174/17 SF |
| 2007/0095543 | A1 | 5/2007 | Tchakarov et al. | |
| 2007/0159789 | A1 | 7/2007 | Schuette et al. | |
| 2011/0068644 | A1 | 3/2011 | Kamp | |
| 2014/0290474 | A1* | 10/2014 | Citterio | F41H 5/0471 |
| | | | | 89/36.02 |
| 2016/0242598 | A1 | 8/2016 | Alexander | |
| 2018/0105063 | A1 | 4/2018 | Wei et al. | |
| 2018/0258796 | A1 | 9/2018 | Jain et al. | |

FOREIGN PATENT DOCUMENTS

| | | |
|---|---|---|
| EP | 2361002 | 8/2011 |
| GB | 2151410 | 7/1985 |
| JP | H09204899 | 8/1998 |
| JP | 2001313487 | 11/2001 |
| JP | 2005039128 | 2/2005 |
| JP | 2011149644 | 7/2011 |
| JP | 2011524839 | 9/2011 |
| WO | 85/03583 | 8/1985 |

OTHER PUBLICATIONS

Examination Report dated Jul. 14, 2022, issued on related Australian Patent application 2018355549 by the Australian Government / IP Australia.
Communication pursuant to Article 94(3) EPC dated Nov. 4, 2021 (Nov. 1, 2021) issued on related European patent application 18801189.4 by the European Patent Office.
Decision to Grant a Patent dated Nov. 3, 20220 (Nov. 30, 2022) issued by the Japanese Patent Office on related Japanese patent application 2020-523298.

* cited by examiner

THERMAL ISOLATION OF FLIGHT RECORDER MEMORY CORE

CROSS-REFERENCE TO RELATED APPLICATIONS

This application is a continuation of and claims priority to U.S. patent application Ser. No. 15/796,588, filed Oct. 26, 2017, the disclosure of which is hereby incorporated by reference in its entirety.

BACKGROUND

Field

Various systems may benefit from appropriate thermal protection. For example, various flight recorder systems may benefit from thermal isolation of a flight recorder memory core.

Description of the Related Art

When aircraft crash, one highly critical source of information regarding the crash comes from the flight recorder. In order to be valuable, therefore, flight recorders are designed to have memories that are crash survivable.

Industry demand is trending towards a desire for larger and crash survivable memory capacities to support multiple long duration voice and video channels and other data. At the same time, large sized commercial memories, when tested, are having difficulties passing temperature testing requirements.

BRIEF DESCRIPTION OF THE DRAWINGS

For proper understanding of the invention, reference should be made to the accompanying drawings, wherein.

SUMMARY

Figure 1:
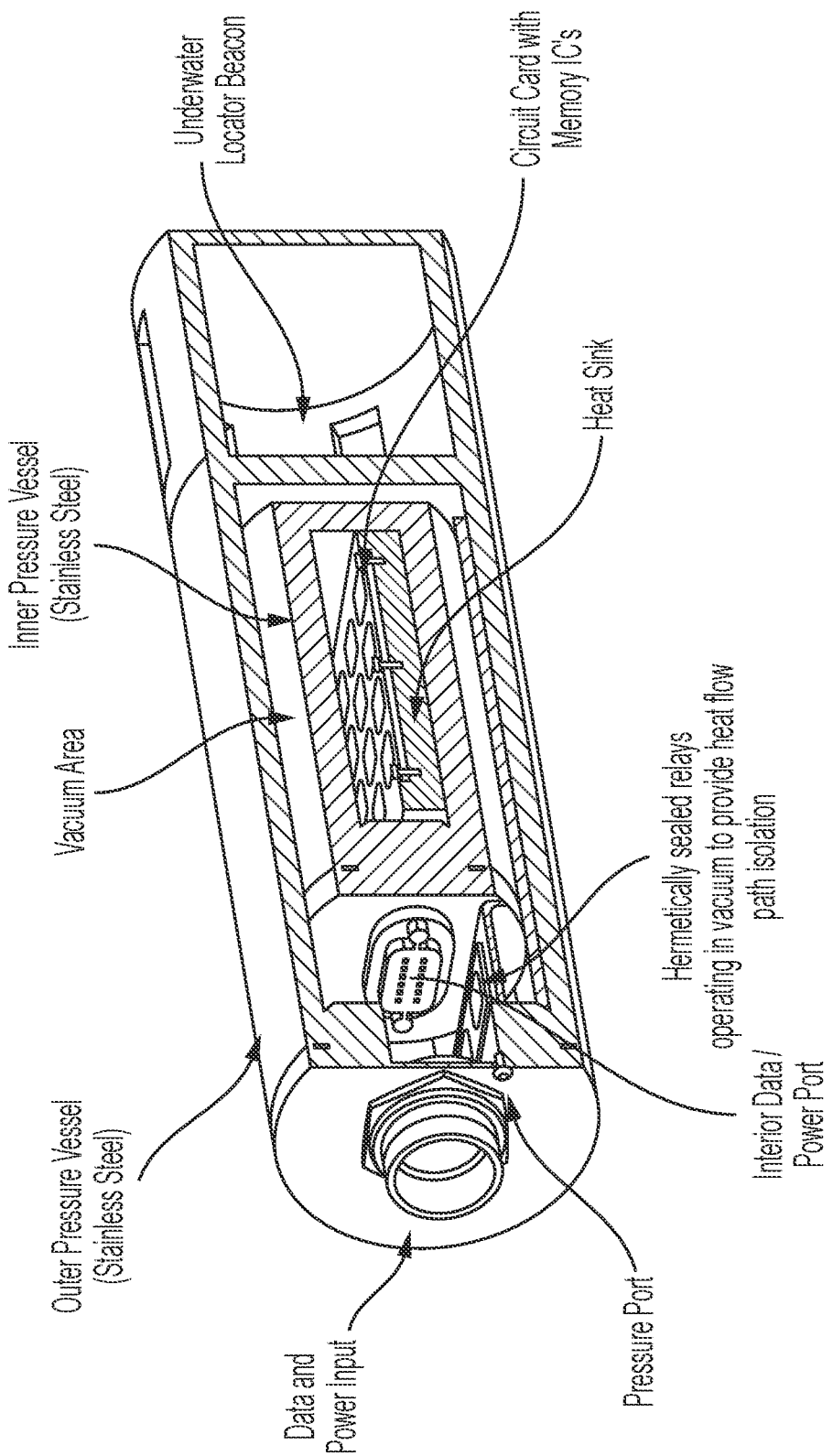
FIG. 1 illustrates an embodiment of a vacuum protected memory, according to certain embodiments of the present invention.

According to certain embodiments of the present invention, a system can include a memory core. The system can also include an inner chamber housing the memory core. The system can further include an outer chamber housing the inner chamber with a vacuum between the inner chamber and the outer chamber. The system can additionally include a first relay within the outer chamber configured to selectively connect and disconnect power from outside the outer chamber to the memory core.

DETAILED DESCRIPTION

Certain embodiments of the present invention relate to flight recorders that can survive temperature tests required by regulation. An example of such regulations is EUROCAE ED-112A, "Minimum Operational Performance Specification for Crash Protected Airborne Recorder Systems."

For example, certain embodiments of the present invention relate to a flight recorder memory concept that can provide memory protection from temperature extremes using vacuum as an insulating medium. Certain embodiments of the present invention, therefore, may allow for the use of higher capacity memory technologies that do not currently survive the required fire tests, such higher capacity memory technologies including but not limited to the following: non-volatile memory such as NVRAM, which can be an example of flash memory, solid-state storage; read only memory (ROM) such as EPROM, EEPROM, masked ROM, and PROM; and volatile memory such as SRAM and DRAM. These memories can all be protected even if they are not the actual chips storing the flight data. Sometimes other integrated circuits and memories are contained within the Crash Survivable Memory Unit (CSMU) that are part of the overall circuitry used in storing data.

The core of the recorder memory architecture can use any desired vacuum flask, such as a Dewar flask or Dewar bottle, named after Sir James Dewar, who is credited with their invention in 1892. Using this approach, conduction and convection of heat may be almost eliminated. Radiated heat can be reduced by use of additional techniques, such as silvering, other reflective techniques or any other desired technique.

In one exemplary embodiment, memory electronics can be housed in an inner core. The inner core can be surrounded by an outer core, with a vacuum separating the two cores. This vacuum separation can be accomplished in any of a variety of ways.

For example, memory electronics which may be housed in an inner core can be inserted into another, larger diameter pressure vessel and sealed. The space between the inner core and the outer vessel can have the air there between evacuated. Another approach may provide concentric vessels (e.g., cylindrical vessels or any other desired shape) that can be sealed at the ends and have the air between them be pumped out through a valve. In a further implementation, concentric vessels (e.g., cylindrical vessels or any other desired shape) can be welded at the open ends in a vacuum space, using electron beam welding, thereby trapping a vacuum between the cylinders. The vessels need not be cylindrical, and therefore, a multitude of shapes can be used for application specific requirements.

Signal communication to the memory core can be done electrically by traditional copper wiring. Alternatively, fiber optic cable can be used, thereby eliminating copper intrusion into the memory core. Power to the memory core can be provided by traditional wiring and can employ techniques for heat path conduction isolation, such techniques for heat path conduction isolation including, without limitation, power transfer via magnetic or electric field. Some specific examples include electromagnetic induction, electrodynamic induction, electrostatic induction, inductive coupling, magnetic resonant induction, microwave power, radio frequency (RF) power, and light or laser power.

FIG. 1 illustrates a vacuum protected memory, according to certain embodiments of the present invention. As shown in FIG. 1, there can be a circuit card with memory integrated circuits (ICs) installed within an inner pressure vessel. In this particular illustration, the inner pressure vessel is stainless steel, but other materials are also permitted. Optionally, the inner pressure vessel may be made of a thermally insulating material, such thermally insulating material which may comprise, without limitation, ceramic insulation, which can be covered with an airtight (vacuum resistant) covering such as glass or metal. The memory can be provided with a heat sink which may also be located within the inner pressure vessel.

The inner pressure vessel can be housed within an outer pressure vessel, which is illustrated as being made of stainless steel, although other materials are also permitted. One or more hermetically sealed relay(s) can operate in a vacuum between the inner pressure vessel and the outer pressure vessel. The relay(s) can provide heat flow path isolation. The outer pressure vessel can include a data and power input port, as well as a pressure port. The pressure port can be used for removing air from between the vessels, thereby creating a vacuum between the inner pressure vessel and the outer pressure vessel.

The data and power lines are not shown, but can be connected from the data and power input to the interior data/power port of the inner pressure vessel. As mentioned above, one or more hermetically sealed relay(s) can be used to provide heat flow path isolation with respect to, for example, the power lines.

An underwater locator beacon can be attached to one end of the outer pressure vessel. In this example, the underwater locator beacon is located at an opposite end of the outer pressure vessel from the data and power input, but the underwater locator beacon could be provided at the same end, or at any other desired location on the outer pressure vessel or indeed at any other part of the entire structure of the vacuum protected memory depicted in FIG. 1.

Figure 2:
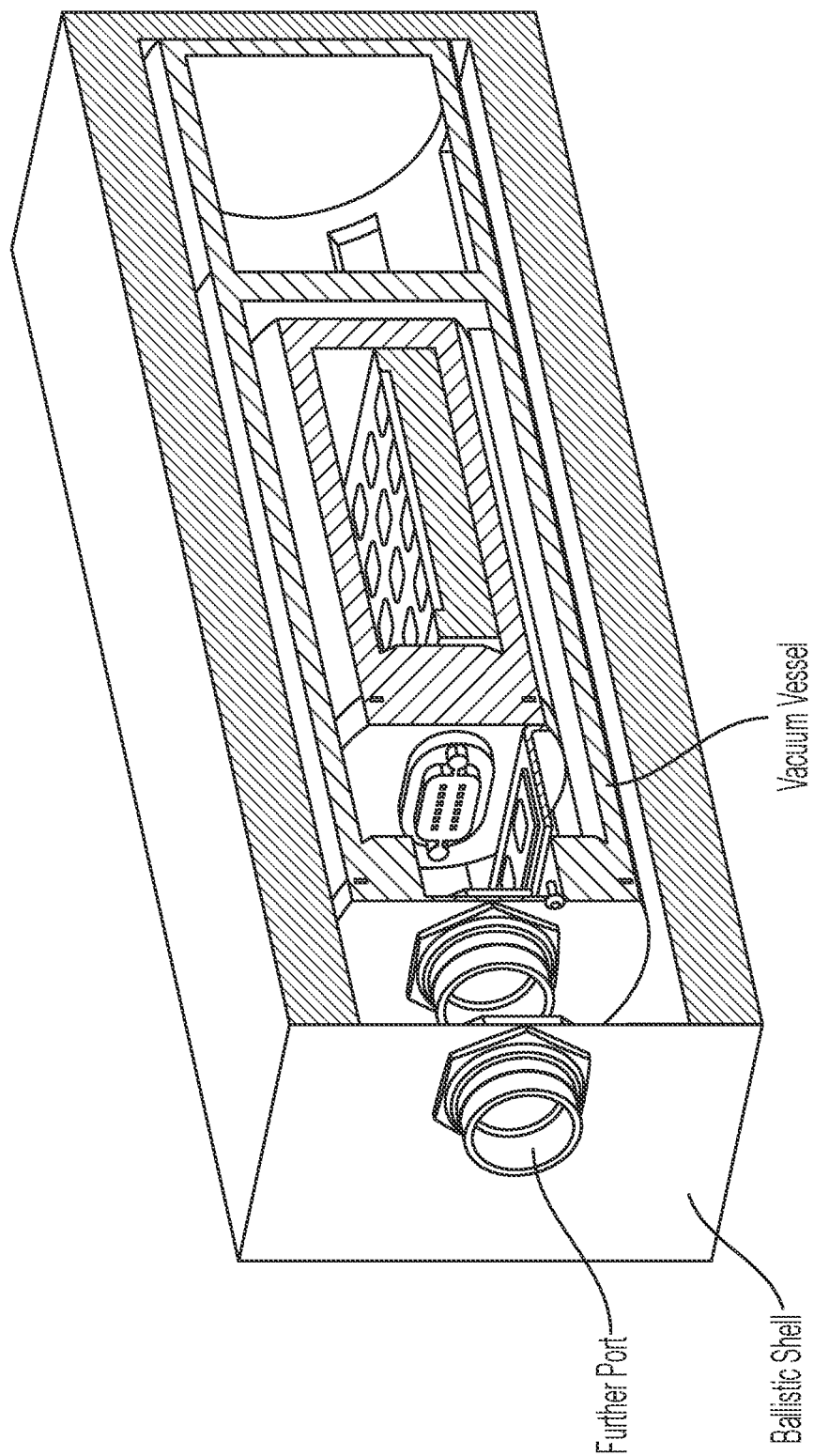
FIG. 2 illustrates a further embodiment of a vacuum protected memory, according to certain embodiments of the present invention.

FIG. 2 illustrates a further embodiment of a vacuum protected memory, according to certain embodiments of the present invention. As shown in FIG. 2, the device can include a vacuum protected memory which can be constructed, for example, as shown and described in FIG. 1.

As also shown in FIG. 2, the device can further include a ballistic shell with a further port. The further port can provide the same connectivity as the data and power input power port of the outer vessel.

The ballistic shell can be designed to further protect the vacuum protected memory from crash forces and penetrating forces. For example, the ballistic shell can encase the vacuum protected memory module with any desired structure, such as an aluminum honeycomb sandwich, to provide resistance to ballistic penetration.

The use of this ballistic shell can be consistent with a progressive protection philosophy. For example, kinetic energy absorption can be provided by the shell, and this can be followed by technologies incorporated for flame protection and high residual heat protection, such as the region of established vacuum.

According to certain embodiments of the present invention, a system can include a memory core for a flight recorder. This memory core can include any desired memory, such as memory integrated circuits, as illustrated in FIGS. 1 and 2.

The system can also include an inner chamber housing the memory core. This inner chamber may be, for example, the inner pressure vessel described above. Any desired heat sink can be provided for the memory core. The heat sink can be provided within the inner chamber. The heat sink can be designed to transmit heat to the wall of the inner chamber.

The system can further include an outer chamber housing the inner chamber with a vacuum between the inner chamber and the outer chamber. The outer chamber may be, for example, the outer pressure vessel described above.

The inner chamber and the outer chamber can be cylinders. Other form factors are also permitted. For example, the form factor could be other three-dimensional concentric shapes, such as concentric boxes (e.g., rectangular, triangular, or square), or even concentric spheres. Embodiments of the present invention may not require that the shape of the inner chamber match the shape of the outer chamber. For example, a square box inner chamber could be housed by a rectangular box outer chamber.

The inner chamber can be set off from the outer chamber by one or more insulating supports. These insulating supports may be, for example, insulating washers or other supports (e.g., ring-shaped supports) that set off the walls of the inner chamber from the walls of the outer chamber, so that there is no direct physical contact between the walls.

The inner chamber and the outer chamber can each be stainless steel, titanium, other similar materials or any other desired materials. Alternatively, the inner chamber may be made from a different material than the outer chamber. In either case, the materials can be selected as having good structural strength.

An inner surface of the outer chamber can be coated with a material that absorbs radiant heat better than the material of the outer chamber, such as a black material or any other material with the desired heat absorption traits. By contrast, an outer surface of the inner chamber can be coated with a material that reflects radiant heat better than the material of the inner chamber, such as a silver surface, a mirror surface or any other material with the desired heat-related traits.

The system can also include a signal path from avionics equipment to the memory core through the outer chamber and the inner chamber.

The system can further include a power path for the memory core through the outer chamber and the inner chamber.

As mentioned above, an underwater locater beacon can be provided at one end of the outer chamber. A ballistic casing can be provided around the outer core, as illustrated in FIG. 2. The ballistic casing can have an aluminum honeycomb structure, or any other similar force-absorbing structure. The ballistic casing may be made from or impregnated with a fire-retardant material that is designed to prevent burning of the ballistic casing.

Figure 3:
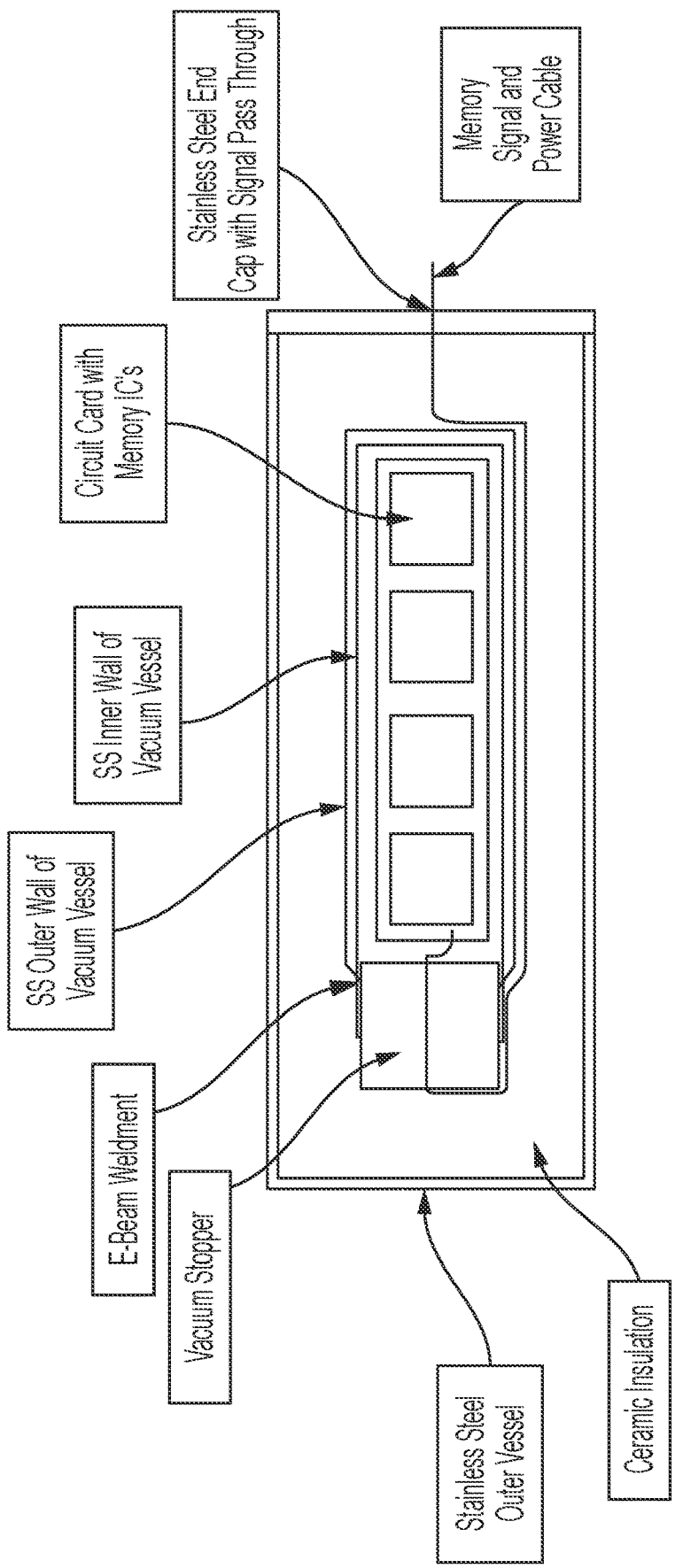
FIG. 3 illustrates an additional embodiment of a vacuum protected memory, according to certain embodiments of the present invention.

FIG. 3 illustrates an additional embodiment of a vacuum protected memory, according to certain embodiments of the present invention. As shown in FIG. 3, additional enhancements can be applied to further strengthen the vacuum protected memory against penetration and crushing, while maintaining the vacuum.

As illustrated in FIG. 3, an inner vacuum vessel can be constructed of two concentric stainless steel tubes. As mentioned above, other materials, such as Titanium are also permitted, and other shapes than tubes are permitted. The difference in radius between the outside of the inner tube and inside of the outer tube can serve as the vacuum zone. A thermally insulating spacer or spacers can establish a stand-off between the two tubes.

The larger tube can be necked down or pinch rolled onto the inner tube and electron beam welded in a vacuum space. A so-called getter material can be included in the vacuum zone to further enhance the quality of the vacuum. As mentioned above, the outer surface of the inner vessel may be reflective, silvered or otherwise configured to reflect radiant heat.

A circuit card for memory can be inserted into the inner space in the vacuum vessel and the vessel can be stoppered with a stopper made of high temperature insulating material, such as ceramic, high temperature polymers, or a dewar stopper made of metal with a cavity in the middle which is a vacuum space. The circuit card can be mounted to a heat sink for circuit generated heat dissipation. Signal and power cable(s) can lead out of the stopper and run down the side of the vacuum vessel.

A stainless steel outer vessel can be constructed from stainless steel tubing and filled with ceramic insulation material from Thermal Ceramics or Advanced Ceramics. The shape of the ceramic insulation material can match the vacuum vessel.

The vacuum vessel can be inserted into the outer vessel, stopper first. In this arrangement, the payload may be farthest from the stopper, and the stopper side may be farthest away from the outer vessel end cap side. The signal cable can be run out of the outer vessel end cap.

In this arrangement, the outer vessel can handle the penetrating and crush testing, and the ceramic insulation can provide a backup in case the vacuum is lost in some way. Another option would be to fill up (or partially fill up) the vacuum vessel with gelatin. Filling the inside of the vacuum vessel with material such as thermally conductive grease or added heat sink(s) could also be a further (unillustrated) option.

More particularly, certain embodiments of the present invention can provide a method or mechanism of isolating memory or other circuits from a direct heat path provided by copper or other heat conductive material such as that provided by signal or power wires.

Certain embodiments of the present invention can work with a flight recorder memory and can provide circuit protection from temperature extremes using vacuum as the insulating medium. The core of the recorder architecture can use a vacuum flask protection approach, in which the memory electronics are housed in an inner core that is inserted into another, larger-diameter pressure vessel and sealed. The space between the two cylinders can have the air evacuated from it. Even though the vacuum can protect the memory from ambient heat, the wiring to the circuitry from the outside to the memory core can provide a heat path, especially through an excellent heat conductor such as copper wiring.

Signal communication to the memory core can be done electrically by traditional copper wiring, or via a fiber optic cable, which would eliminate copper intrusion into the memory core. However, if power to the memory core is provided by wires which lead from the high outside temperatures to the inside of the protected memory area, then the wires can pass through a relay mounted inside the vacuum chamber, as shown in FIG. 1, which provides heat conduction isolation. The relay, or other disconnecting device, can be hermetically sealed, leaving no heat conduction or convection path into the memory core. The relay can be actuated or opened by one or more of several elements, such as a heat sensor, computer control, or loss of aircraft power.

Figure 4A:
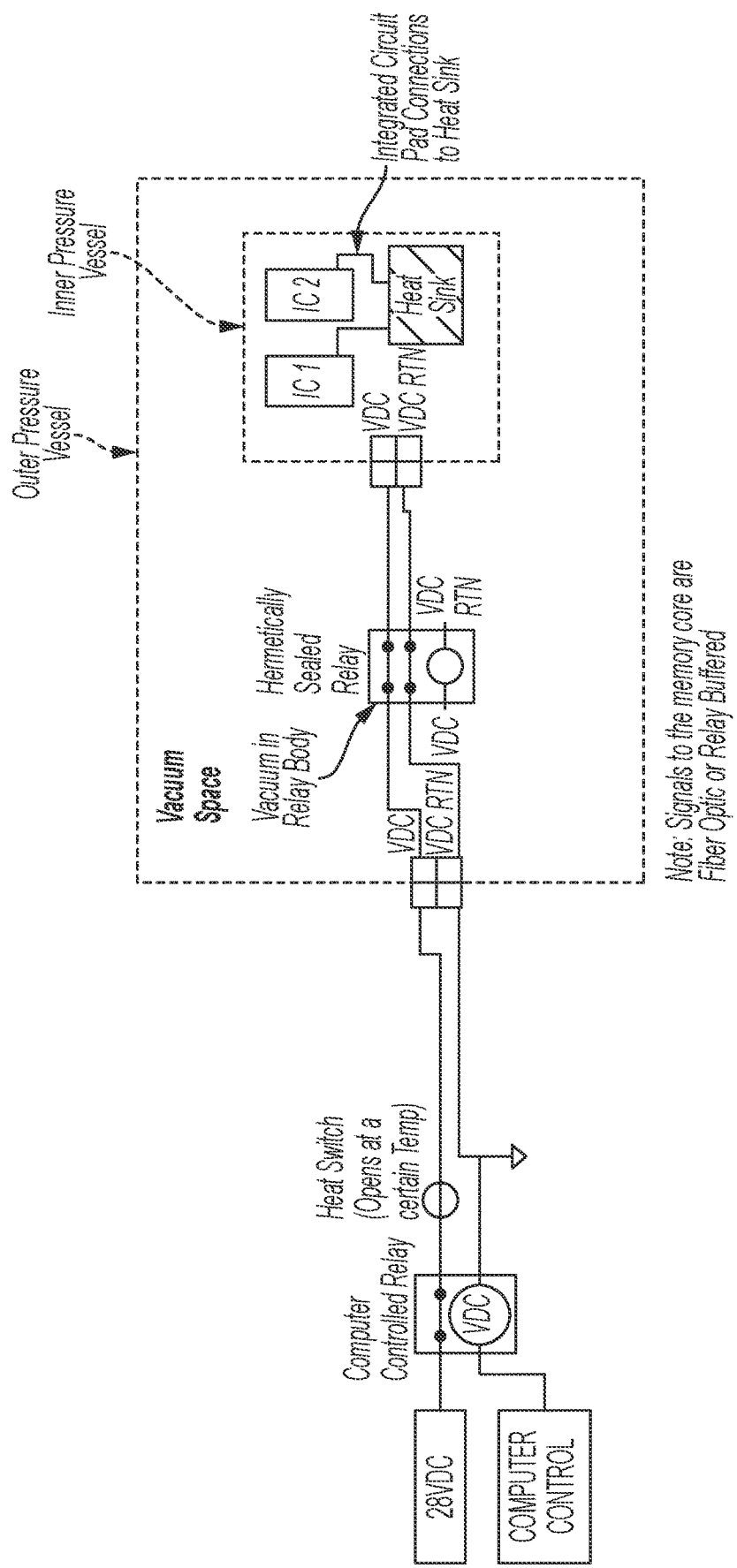
FIG. 4A illustrates a high isolation circuit in a closed position, according to certain embodiments of the present invention.

FIG. 4A illustrates a high isolation circuit in a closed position, according to certain embodiments of the present invention. As disclosed above, signals to the memory core can be through fiber optic transmission or relay buffered. As in the previous examples, there can be an outer pressure vessel and an inner pressure vessel. Within the inner pressure vessel, there can be a plurality of integrated circuits, in this exemplary case IC 1 and IC 2, which can have pad connections to a heat sink. There can be two or more power connections into the inner pressure vessel, in this exemplary case, a direct current (DC) voltage (VDC) path and a return (RTN) path. Both the VDC path and the return path RTN can extend through the wall of the inner pressure vessel, through a hermetically sealed relay, and then through the wall of the outer pressure vessel.

Because the relay is hermetically sealed, the relay may or optionally may not contain a vacuum. The relay can be configured to break the circuit when the voltage VDC gets too close to return voltage VDC RTN. For example, the relay may break the circuit when the voltage VDC is reduced in amplitude to an extent that the relay is no longer provided with sufficient excitation to maintain the closure of the relay contacts.

Outside the outer pressure vessel, a computer controlled relay can be used to either provide VDC or break the circuit. The computer controlled relay may break the circuit when predetermined conditions exist. Examples of conditions for which the computer controlled relay may break the relay circuit are as follows: detection of high ambient temperature by sensors; detection of aircraft crash by g-switch, breakage of frangible lines, or other means; or detection of imminent loss or actual loss of aircraft power. The circuit can also include a heat switch, which can be configured to open at a certain temperature. The heat switches can open upon reaching a certain temperature. A determination could be made as to what is an unacceptable temperature, and the heat switch can be designed to open if that temperature is reached. The VDC path can be powered by voltage source, such as a 28 volts DC voltage source. A computer controller, which may include a processor and memory, can control the computer-controlled relay.

Figure 4B:
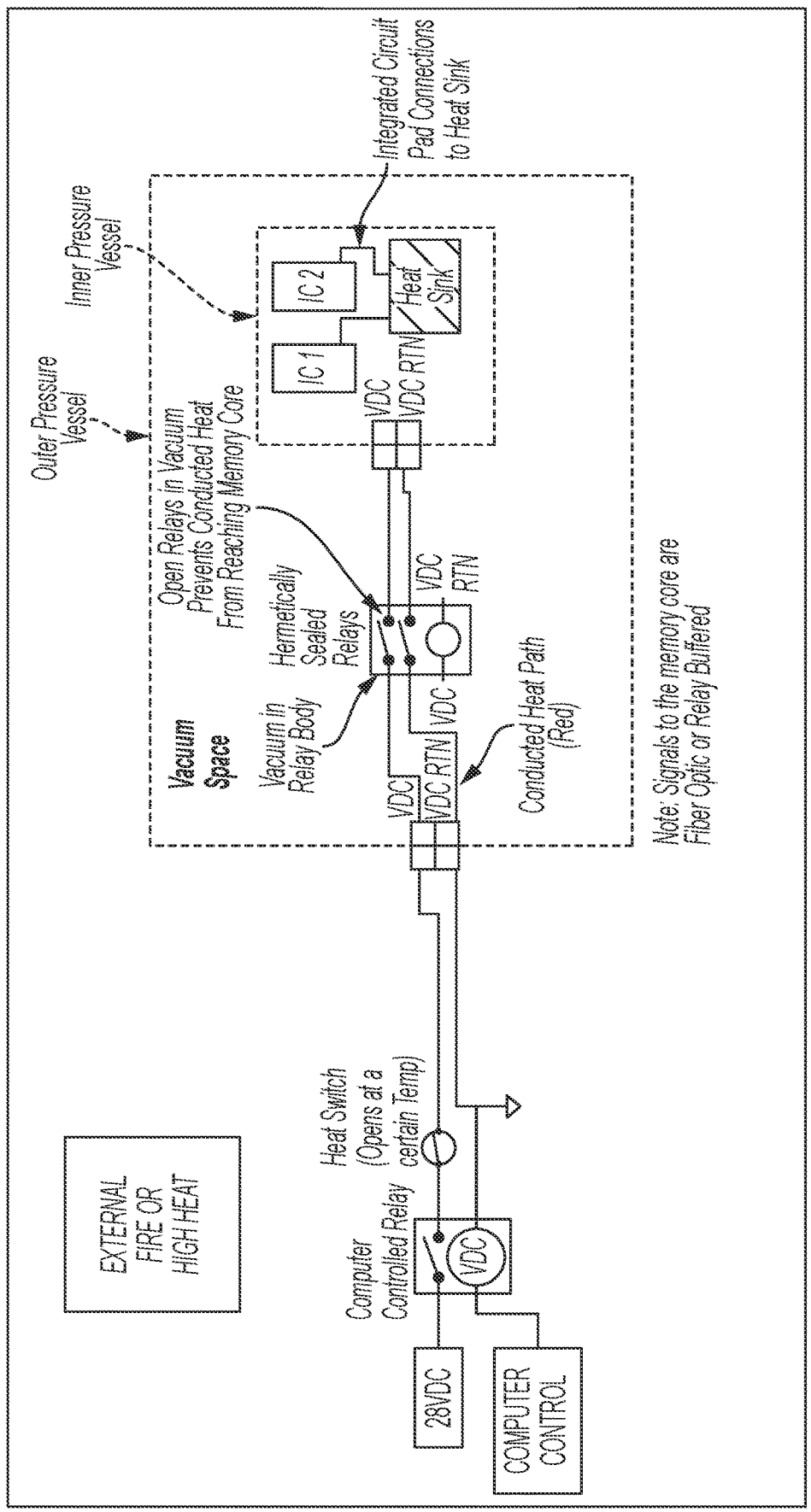
FIG. 4B illustrates a high isolation circuit in an open position, according to certain embodiments of the present invention.

FIG. 4B illustrates a high isolation circuit in an open position, according to certain embodiments of the present invention. FIG. 4B illustrates the same exemplary circuit as FIG. 4A, but with the computer controlled relay open, the heat switch open, and the hermetically sealed relay open.

One having ordinary skill in the art will readily understand that the invention, as discussed above, may be practiced with steps in a different order, and/or with hardware elements in configurations which are different than those which are disclosed. Therefore, although the invention has been described based upon these disclosed embodiments, it would be apparent to those of skill in the art that certain modifications, variations, and alternative constructions would be apparent, while remaining within the spirit and scope of the invention.

We claim:

1. A method of thermally-protecting a memory core, the method comprising:
   housing a memory core within an inner chamber;
   housing the inner chamber, having the memory core therewithin, within an outer chamber;
   coating the inner chamber with a material that is configured to reflect radiant heat;
   providing a vacuum between the inner chamber and the outer chamber; and
   providing a first relay within the outer chamber, wherein the first relay is configured to selectively connect an disconnect power from outside the outer chamber to the memory core.

2. The method of claim 1, further comprising:
   providing a fiber optic signal path from outside the outer chamber to the memory core.

3. The method of claim 1, further comprising:
   providing a second relay within the outer chamber, wherein the second relay is configured to selectively connect and disconnect a signal path from outside the outer chamber to the memory core.

4. The method of claim 1, further comprising:
providing a heat sink within the inner chamber.

5. The method of claim 1, wherein the inner chamber and the outer chamber are cylinders, concentric boxes, or concentric spheres.

6. The method of claim 1, wherein the inner chamber is set off from the outer chamber by one or more insulating supports.

7. The method of claim 1, wherein the outer chamber comprises stainless steel or titanium.

8. The method of claim 1, further comprising:
coating an inner surface of the outer chamber with a material that is configured to absorb radiant heat.

9. The method of claim 1, wherein the inner chamber comprises stainless steel or titanium.

10. The method of claim 1, further comprising:
providing a ballistic casing around the outer chamber.

11. The method of claim 10, wherein the ballistic casing comprises an aluminum honeycomb structure.

12. A method of communication with a memory core, the method comprising:
selectively connecting and disconnecting a power source with a memory core, the selectively connecting and disconnecting comprising:
transmitting a signal from the power source through an outer chamber, through a vacuum disposed within the outer chamber, through an inner chamber, and to the memory core disposed within the inner chamber, wherein an outer surface of the inner chamber is coated with a material that is configured to reflect radiant heat.

\* \* \* \* \*